US011222896B2

(12) United States Patent
Hsu et al.

(10) Patent No.: US 11,222,896 B2
(45) Date of Patent: Jan. 11, 2022

(54) SEMICONDUCTOR ARRANGEMENT WITH CAPACITOR AND METHOD OF FABRICATING THE SAME

(71) Applicant: TAIWAN SEMICONDUCTOR MANUFACTURING COMPANY LIMITED, Hsin-Chu (TW)

(72) Inventors: Chern-Yow Hsu, Chu-Bei (TW); Chen-Jong Wang, Hsin-Chu (TW); Chia-Shiung Tsai, Hsin-Chu (TW); Ming Chyi Liu, Hsinchu (TW); Shih-Chang Liu, Alian Township (TW); Xiaomeng Chen, Baoshan Township (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/677,783

(22) Filed: Nov. 8, 2019

(65) Prior Publication Data
US 2020/0075600 A1   Mar. 5, 2020

Related U.S. Application Data

(60) Continuation of application No. 15/817,333, filed on Nov. 20, 2017, now Pat. No. 10,504,904, which is a division of application No. 14/144,676, filed on Dec. 31, 2013, now Pat. No. 9,825,040.

(51) Int. Cl.
*H01L 27/108* (2006.01)
*H01L 49/02* (2006.01)

(52) U.S. Cl.
CPC .. *H01L 27/10814* (2013.01); *H01L 27/10852* (2013.01); *H01L 28/90* (2013.01)

(58) Field of Classification Search
CPC .......................... H01L 23/5223; H01L 23/642
USPC .................................. 257/300, 301, 307, 642
See application file for complete search history.

(56) References Cited

U.S. PATENT DOCUMENTS

| 6,767,788 | B2 * | 7/2004 | Kim ................... H01L 21/76843 438/253 |
| 7,015,564 | B2 * | 3/2006 | Nagano .................... H01L 28/55 257/295 |
| 2004/0077143 | A1 | 4/2004 | Lee et al. |
| 2004/0212000 | A1 | 10/2004 | Matsui et al. |
| 2005/0124113 | A1 | 6/2005 | Yoneda |
| 2007/0057306 | A1 * | 3/2007 | Nakamura ............... H01L 28/91 257/310 |
| 2008/0003740 | A1 | 1/2008 | Wunnicke et al. |
| 2008/0050874 | A1 * | 2/2008 | Won .................. H01L 23/53238 438/250 |
| 2008/0211002 | A1 * | 9/2008 | Nakamura ............... H01L 28/91 257/303 |
| 2011/0183488 | A1 * | 7/2011 | Takaishi ............ H01L 21/76897 438/381 |

(Continued)

*Primary Examiner* — Tan N Tran
(74) *Attorney, Agent, or Firm* — Cooper Legal Group, LLC

(57) ABSTRACT

A semiconductor arrangement includes an active region including a semiconductor device. The semiconductor arrangement includes a capacitor. The capacitor includes a first electrode over at least one dielectric layer over the active region. The first electrode surrounds an open space within the capacitor. The first electrode has a non-linear first electrode sidewall.

20 Claims, 16 Drawing Sheets

(56) References Cited

U.S. PATENT DOCUMENTS

2012/0223412 A1* 9/2012 Baars ................ H01L 27/10852
257/532
2012/0302033 A1* 11/2012 Yasuda ............. H01L 29/66181
438/394

* cited by examiner

FIG. 8

SEMICONDUCTOR ARRANGEMENT WITH CAPACITOR AND METHOD OF FABRICATING THE SAME

RELATED APPLICATIONS

This application is a continuation of and claims priority to U.S. patent application Ser. No. 15/817,333, titled "SEMICONDUCTOR ARRANGEMENT WITH CAPACITOR AND METHOD OF FABRICATING THE SAME" and filed on Nov. 20, 2017, which is a divisional of and claims priority to U.S. patent application Ser. No. 14/144,676, titled "SEMICONDUCTOR ARRANGEMENT WITH CAPACITOR AND METHOD OF FABRICATING THE SAME" and filed on Dec. 31, 2013. U.S. patent application Ser. No. 15/817,333 and U.S. patent application Ser. No. 14/144,676 are incorporated herein by reference.

BACKGROUND

Capacitors are useful to, among other things, store electrical charge within circuits.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

FIG. 8 illustrates a portion of a semiconductor arrangement and a cross-section view at intermediate steps of manufacturing the same, according to an embodiment;

DETAILED DESCRIPTION

Figure 1:
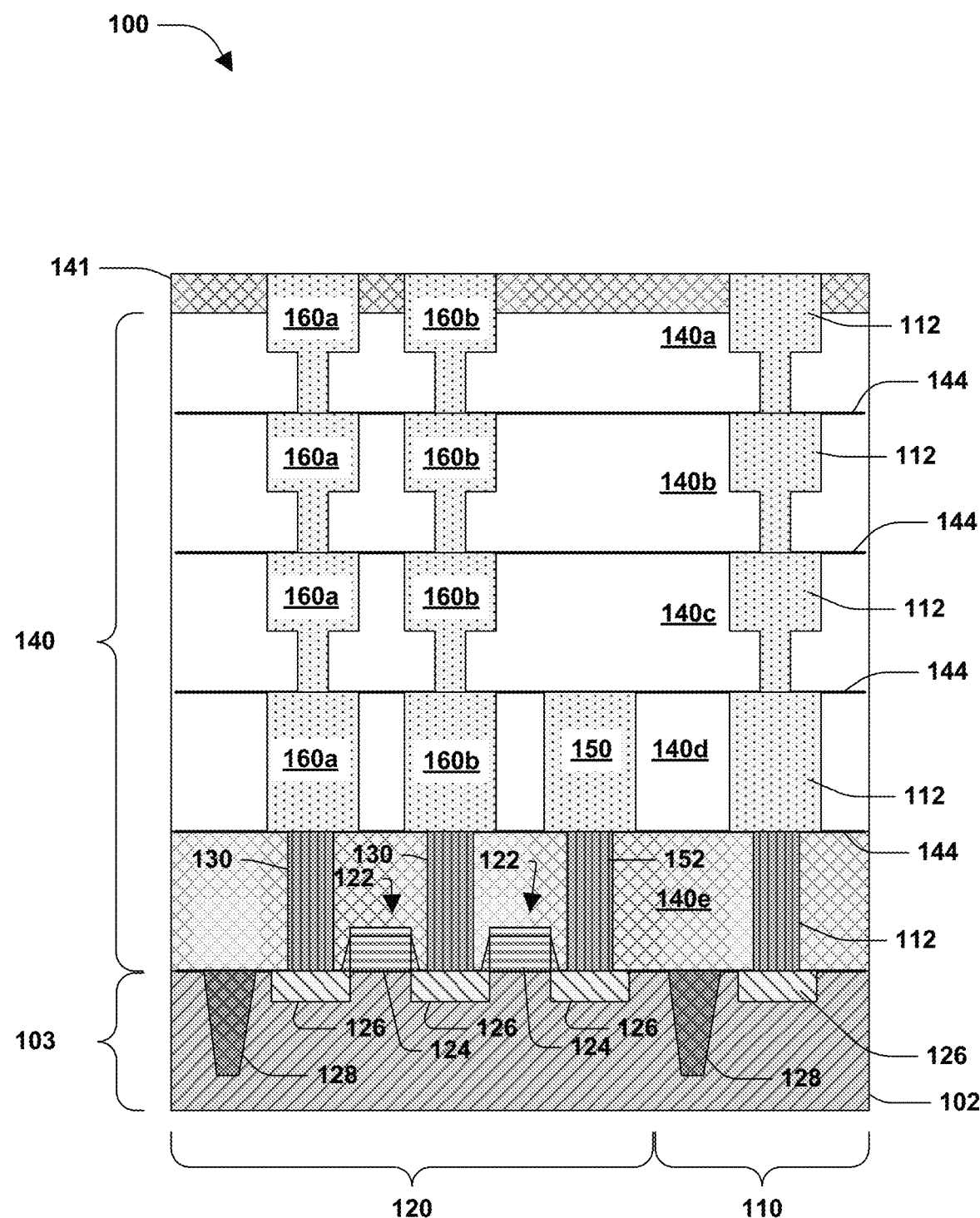
FIG. 1 illustrates a portion of a semiconductor arrangement and a cross-section view at intermediate steps of manufacturing the same, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

FIG. 1 is a perspective view illustrating a portion of a semiconductor arrangement 100 according to some embodiments. In some embodiments, the semiconductor arrangement 100 is formed in or on a substrate 102, where an active region 103 is formed in the substrate 102. In some embodiments, the substrate 102 comprises at least one of silicon, polysilicon, or germanium. According to some embodiments, the substrate 102 comprises at least one of an epitaxial layer, a silicon-on-insulator (SOI) structure, a wafer, or a die formed from a wafer.

According to some embodiments, the semiconductor arrangement 100 comprises a logic region 110 and a memory region 120. In an embodiment, the logic region 110 is formed on or within the active region 103. In some embodiments, the logic region 110 comprises one or more logic contacts 112 that are electrically connected within the logic region 110 and connected to the active region 103.

According to some embodiments, the memory region 120 comprises one or more DRAM cells. In some embodiments, the memory region 120 comprises a semiconductor device 122 formed on or within the active region 103. In some embodiments, the semiconductor device 122 comprises a gate region 124, a source/drain region 126, etc. In an embodiment, one or more STI regions 128 are formed within the active region 103. In some embodiments, the memory region 120 comprises one or more contacts 130 that are electrically connected to the source/drain regions 126.

In some embodiments, the semiconductor arrangement 100 comprises one or more dielectric layers 140 formed over the active region 103 and the semiconductor device 122. According to some embodiments, the one or more dielectric layers 140 comprise a first dielectric layer 140a, a second dielectric layer 140b, a third dielectric layer 140c, a fourth dielectric layer 140d, and a fifth dielectric layer 140e. In some embodiments, the dielectric layers 140 comprise a standard dielectric material with a medium or low dielectric constant, such as $SiO_2$. In some embodiments, the dielectric layers 140 comprise a dielectric material with a relatively high dielectric constant.

In some embodiments, formation of at least one of the dielectric layers 140 comprises at least one of thermal growth, chemical growth, atomic layer deposition (ALD), chemical vapor deposition (CVD), plasma-enhanced chemical vapor deposition (PECVD), etc.

In some embodiments, the semiconductor arrangement 100 comprises one or more low-k dielectric layers 141 formed over the dielectric layers 140. In some embodiments, the low-k dielectric layer 141 comprises a dielectric material with a relatively low dielectric constant, such as $SiO_2$. Formation of the low-k dielectric layer 141 comprises at least one of thermal growth, chemical growth, atomic layer deposition (ALD), chemical vapor deposition (CVD), plasma-enhanced chemical vapor deposition (PECVD), etc.

In some embodiments, the semiconductor arrangement 100 comprises one or more etch stop layers 144 separating the dielectric layers 140. In some embodiments, the etch stop layers 144 stop an etching process between the dielectric layers 140. According to some embodiments, the etch stop layers 144 comprise a dielectric material having a different etch selectivity from the dielectric layers 140. In some embodiments, one or more of the etch stop layers 144 comprises SiC, SiN, SiCN, SiCO, CN, etc., alone or in combination. In some embodiments, formation of at least one of the etch stop layers 144 comprises at least one of thermal growth, chemical growth, atomic layer deposition (ALD), chemical vapor deposition (CVD), plasma-enhanced chemical vapor deposition (PECVD), etc.

In some embodiments, the semiconductor arrangement 100 comprises a bit line 150. In an embodiment, the bit line 150 extends through the fourth dielectric layer 140d. According to some embodiments, the bit line 150 comprises a metal material and is connected to the source/drain region 126 through a contact 152. In some embodiments, the bit line 150 is formed in a region or portion of the semiconductor arrangement 100 between the active region 103 and at least one capacitor. According to some embodiments, a portion of the bit line 150 and a portion of at least one capacitor overlap in a horizontal plane. In some embodiments, the bit line 150 and capacitor(s) do not overlap in any horizontal plane.

In some embodiments, the semiconductor arrangement 100 comprises one or more metal structures 160. In an embodiment, the metal structures 160 extend through the low-k dielectric layer 141 and the dielectric layers 140. In some embodiments, the metal structures 160 comprise first metal structures 160a and second metal structures 160b. Formation of the metal structures 160 comprises at least one of a single damascene process, dual damascene process, etc. In some embodiments, the metal structures 160 provide an electrical connection through at least one of the dielectric layers 140 to the semiconductor device 122 of the active region 103. In some embodiments, the metal structures 160 are connected to the source/drain regions 126 through the contacts 130. According to some embodiments, the metal structures 160 comprise copper, a copper glue layer, TaN, TiN, etc., alone or in combination.

Figure 2:
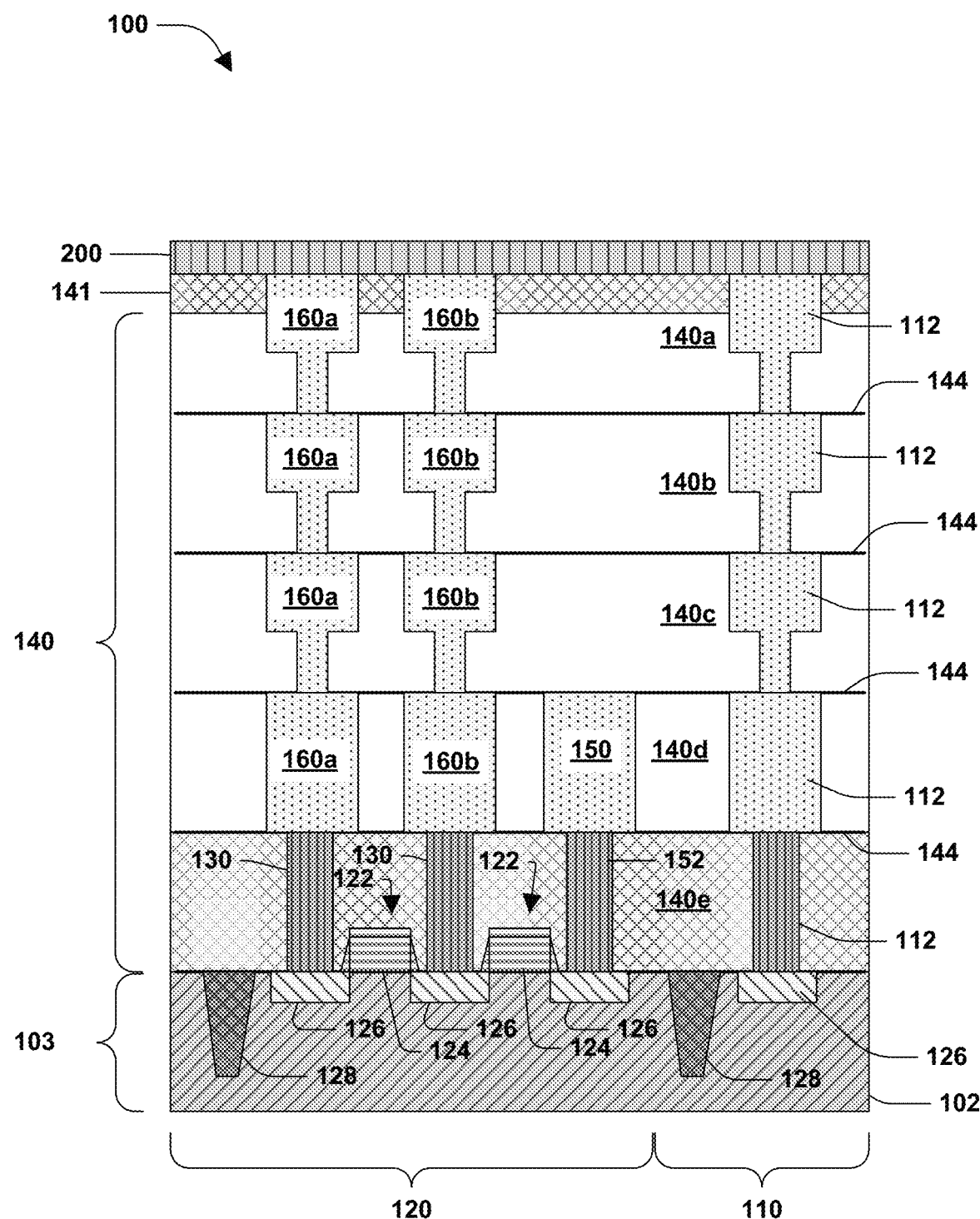
FIG. 2 illustrates a portion of a semiconductor arrangement and a cross-section view at intermediate steps of manufacturing the same, according to an embodiment.

Turning to FIG. 2, according to some embodiments, a first mask layer 200 is formed over the low-k dielectric layer 141. In some embodiments, the first mask layer 200 covers the logic region 110 and the memory region 120. Formation of the first mask layer 200 comprises at least one of deposition, chemical vapor deposition (CVD), or other suitable methods, for example. The first mask layer 200 comprises any number of materials, including carbon, oxides, silicon oxide, nitrides, silicon nitride, $Si_3N_4$, etc., alone or in combination.

Figure 3:
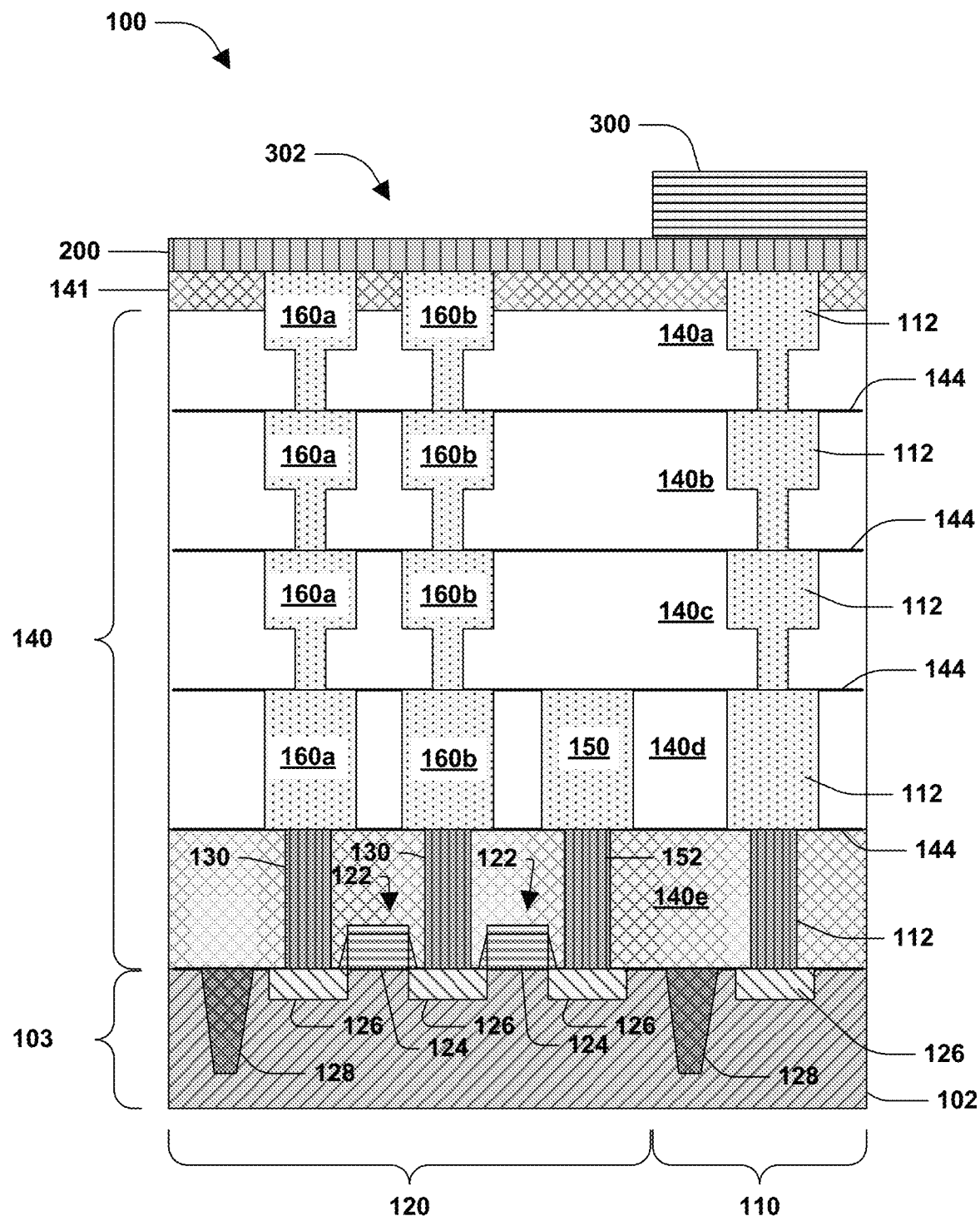
FIG. 3 illustrates a portion of a semiconductor arrangement and a cross-section view at intermediate steps of manufacturing the same, according to an embodiment.

Turning to FIG. 3, according to some embodiments, a second mask layer 300 is formed over the first mask layer 200. Formation of the second mask layer 300 comprises at least one of deposition, chemical vapor deposition (CVD), or other suitable methods, for example. The second mask layer 300 comprises any number of materials, including carbon, oxides, silicon oxide, nitrides, silicon nitride, $Si_3N_4$, etc., alone or in combination.

In some embodiments, the second mask layer 300 is patterned and etched to form a second mask opening 302. In an embodiment, the second mask opening 302 is formed over the first metal structures 160a. In some embodiments, the second mask opening 302 is formed over the second metal structures 160b.

Figure 4:
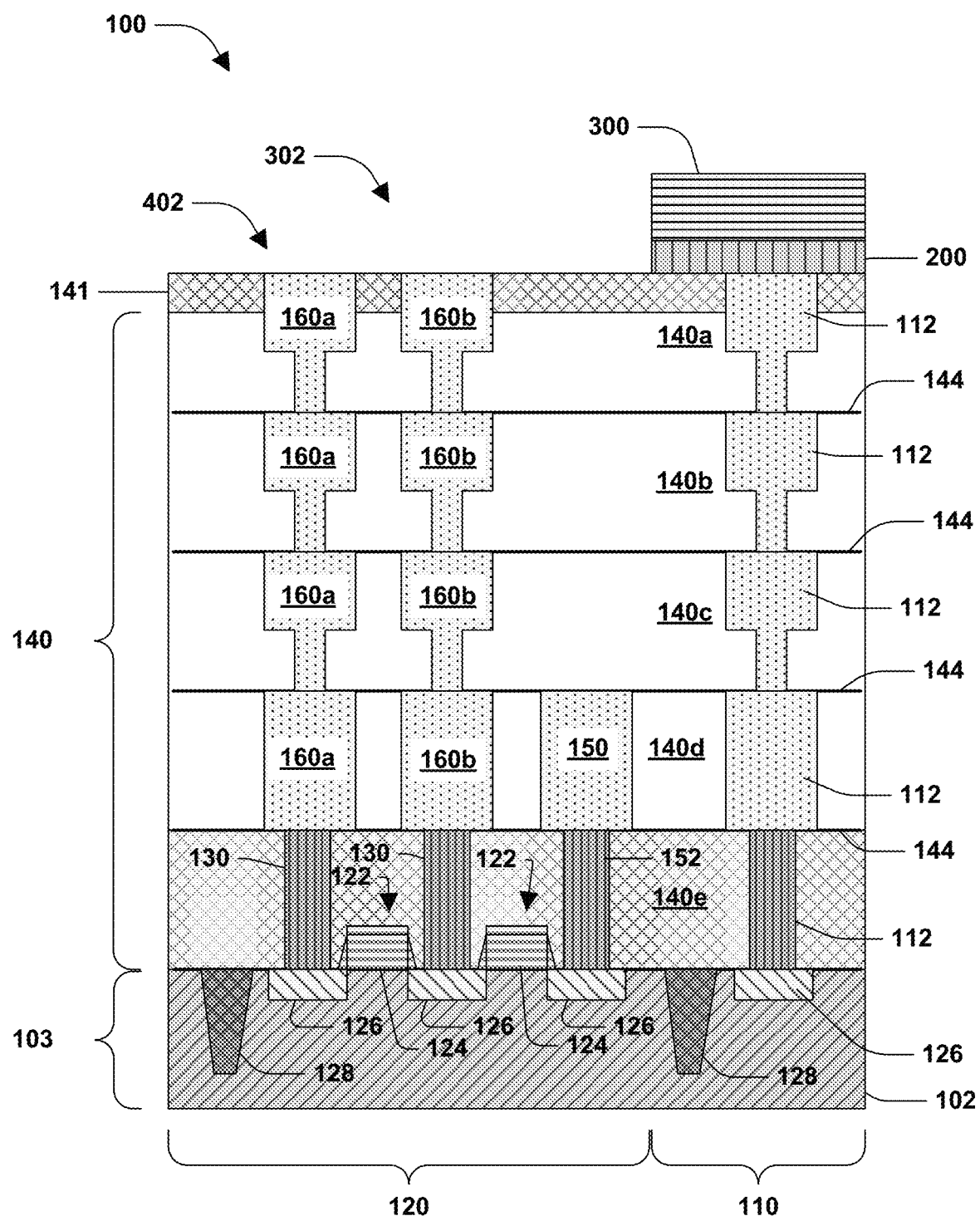
FIG. 4 illustrates a portion of a semiconductor arrangement and a cross-section view at intermediate steps of manufacturing the same, according to an embodiment.

Turning to FIG. 4, according to some embodiments, the first mask layer 200 is patterned and etched to form a first mask opening 402. In an embodiment, the first mask opening 402 is formed over the first metal structures 160a. In some embodiments, the first mask opening 402 is formed over the second metal structures 160b.

Figure 5:
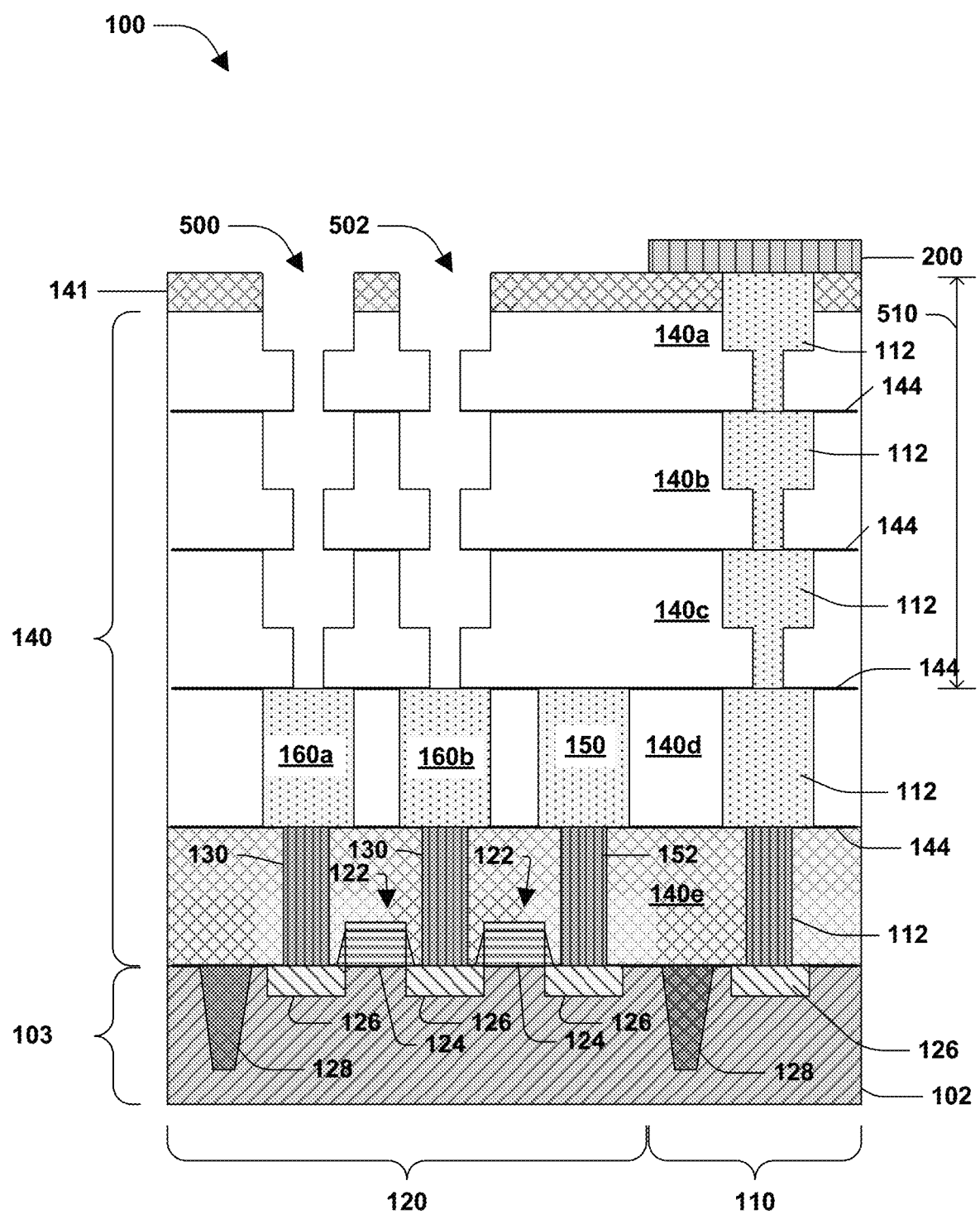
FIG. 5 illustrates a portion of a semiconductor arrangement and a cross-section view at intermediate steps of manufacturing the same, according to an embodiment.

Turning to FIG. 5, according to some embodiments, the second mask layer 300 is removed, such as by wet etching, dry etching, etc. In some embodiments, a first opening 500 and a second opening 502 are formed in the low-k dielectric layer 141 and the dielectric layers 140. The first opening 500 and second opening 502 are formed in any number of ways. In some embodiments, the first opening 500 and second opening 502 are formed by etching and removing portions of the low-k dielectric layer 141, such as by wet etching, copper wet etching, etc.

In some embodiments, the first opening 500 is formed by etching and removing one or more of the first metal structures 160a. According to some embodiments, the first opening 500 is formed by etching and removing three of the first metal structures 160a. In some embodiments, the second opening 502 is formed by etching and removing one or more of the second metal structures 160b. According to some embodiments, the second opening 502 is formed by etching and removing three of the second metal structures 160b. According to some embodiments, an etch chemistry for etching through the first metal structures 160a or the second metal structures 160b comprises $HNO_3$, $H_3PO_4$, $NH_3$, $NH_4Cl$, $H_2SO_4$, HCl, HaC, KCN, $H_2O_2$, etc., alone or in combination. In some embodiments, the first opening 500 and second opening 502 are formed by etching through the etch stop layer 144, such as with a plasma metal etch.

Figure 6:
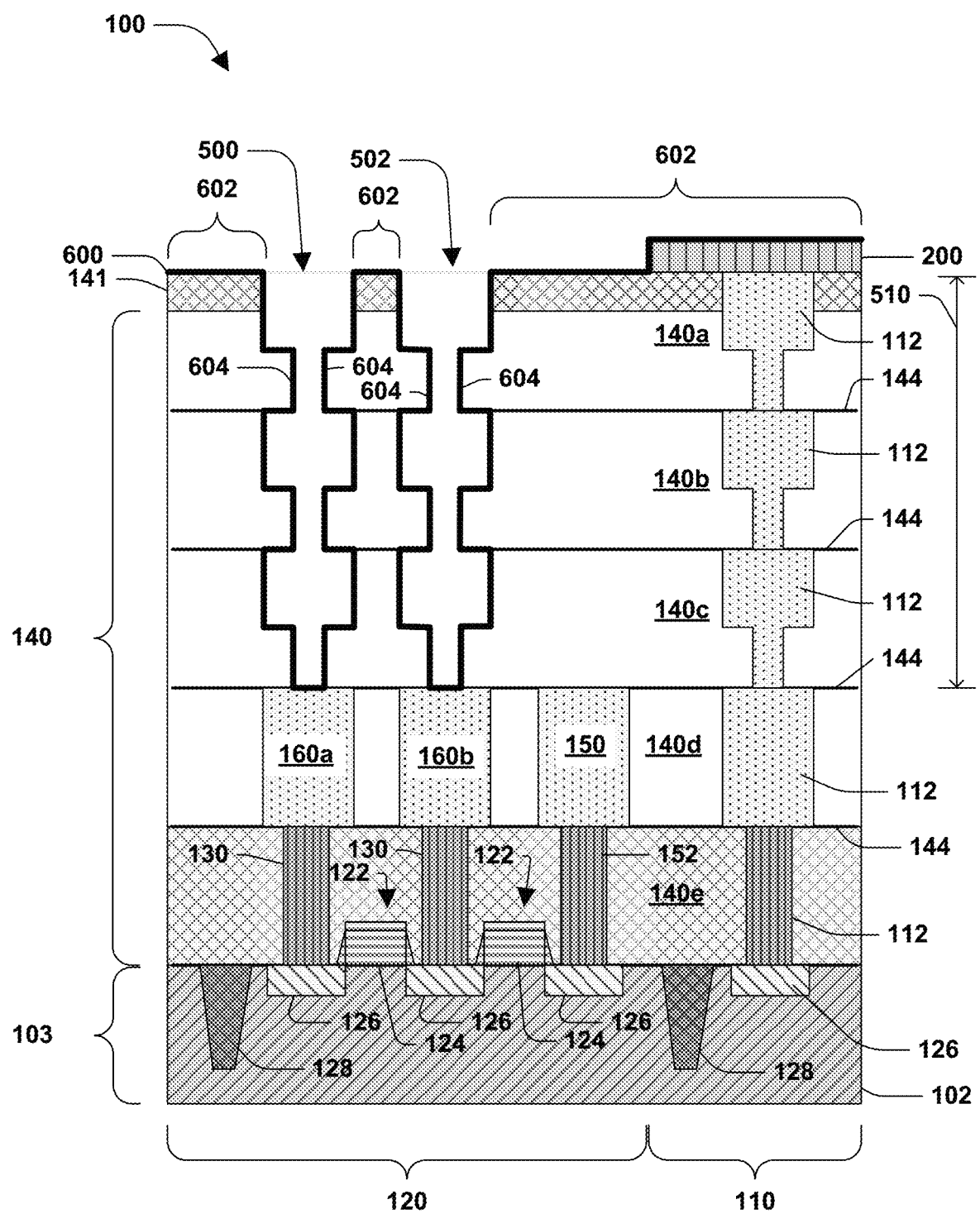
FIG. 6 illustrates a portion of a semiconductor arrangement and a cross-section view at intermediate steps of manufacturing the same, according to an embodiment.

Turning to FIG. 6, according to some embodiments, a first electrode 600 is formed within the first opening 500 and second opening 502 and over the low-k dielectric layer 141. Formation of the first electrode 600 comprises at least one of atomic layer deposition (ALD), sputtering, thermal evaporation, chemical vapor deposition (CVD), etc., for example. According to some embodiments, a surface portion 602 of the first electrode 600 is formed over the low-k dielectric layer 141 and the first mask layer 200. In an embodiment, the first electrode 600 comprises a non-linear first electrode sidewall 604. In some embodiments, the first electrode 600 comprises a conductive material, such as Ti, TiN, Ta, TaN, TaC, W, Jr, Ru, Pt, aluminum, copper, polysilicon, etc., alone or in combination. In an embodiment, the first electrode 600 is electrically connected to the first metal structures 160a and second metal structures 160b.

Figure 7:
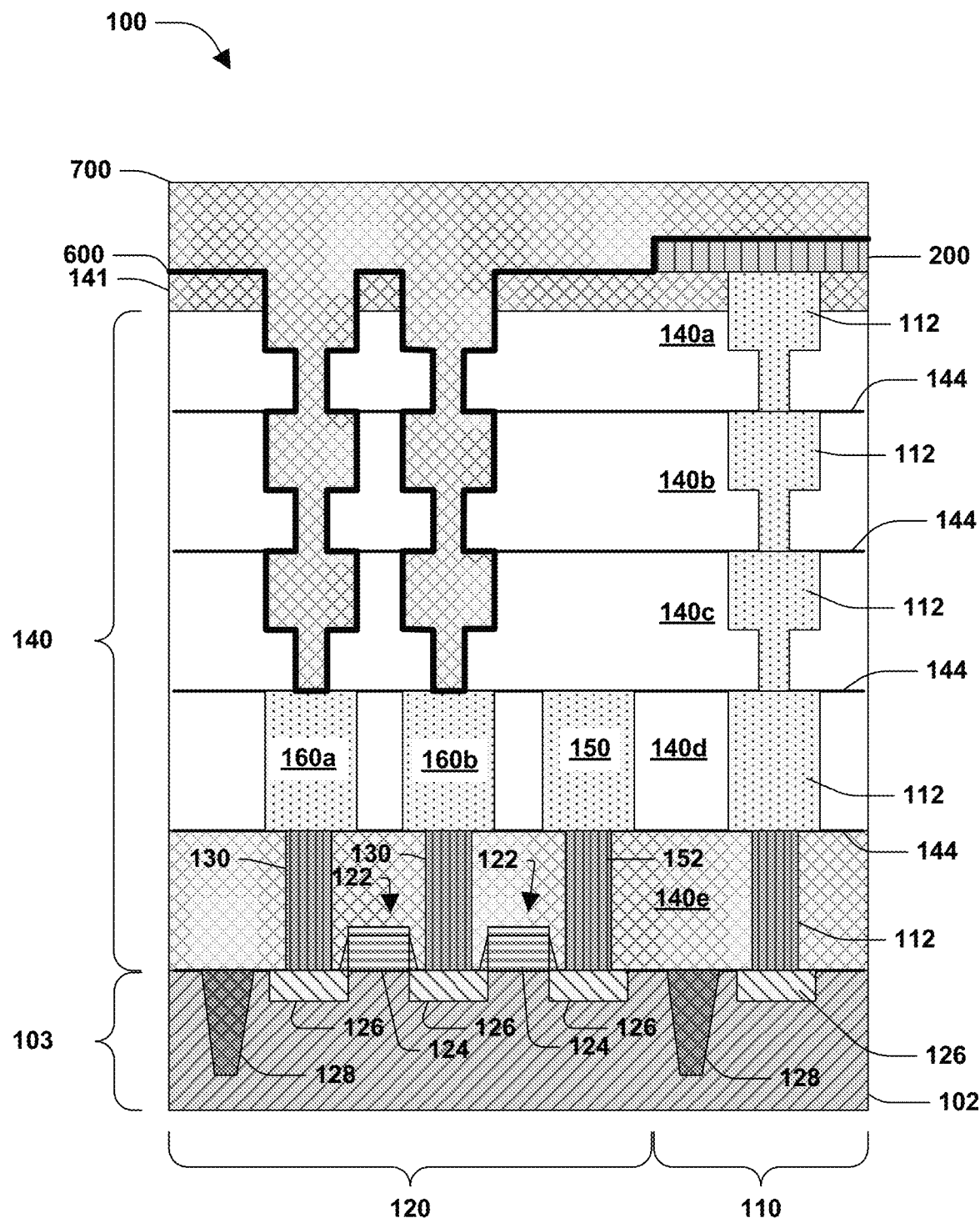
FIG. 7 illustrates a portion of a semiconductor arrangement and a cross-section view at intermediate steps of manufacturing the same, according to an embodiment.

Turning to FIG. 7, in some embodiments, a bottom anti-reflective coating (BARC) layer 700 is formed over the first electrode 600. The BARC layer 700 comprises any number of materials, including silicon, SiOC, other semiconductor materials, etc. In some embodiments, the BARC layer 700 is formed within the first opening 500 and second opening 502.

Figure 8:
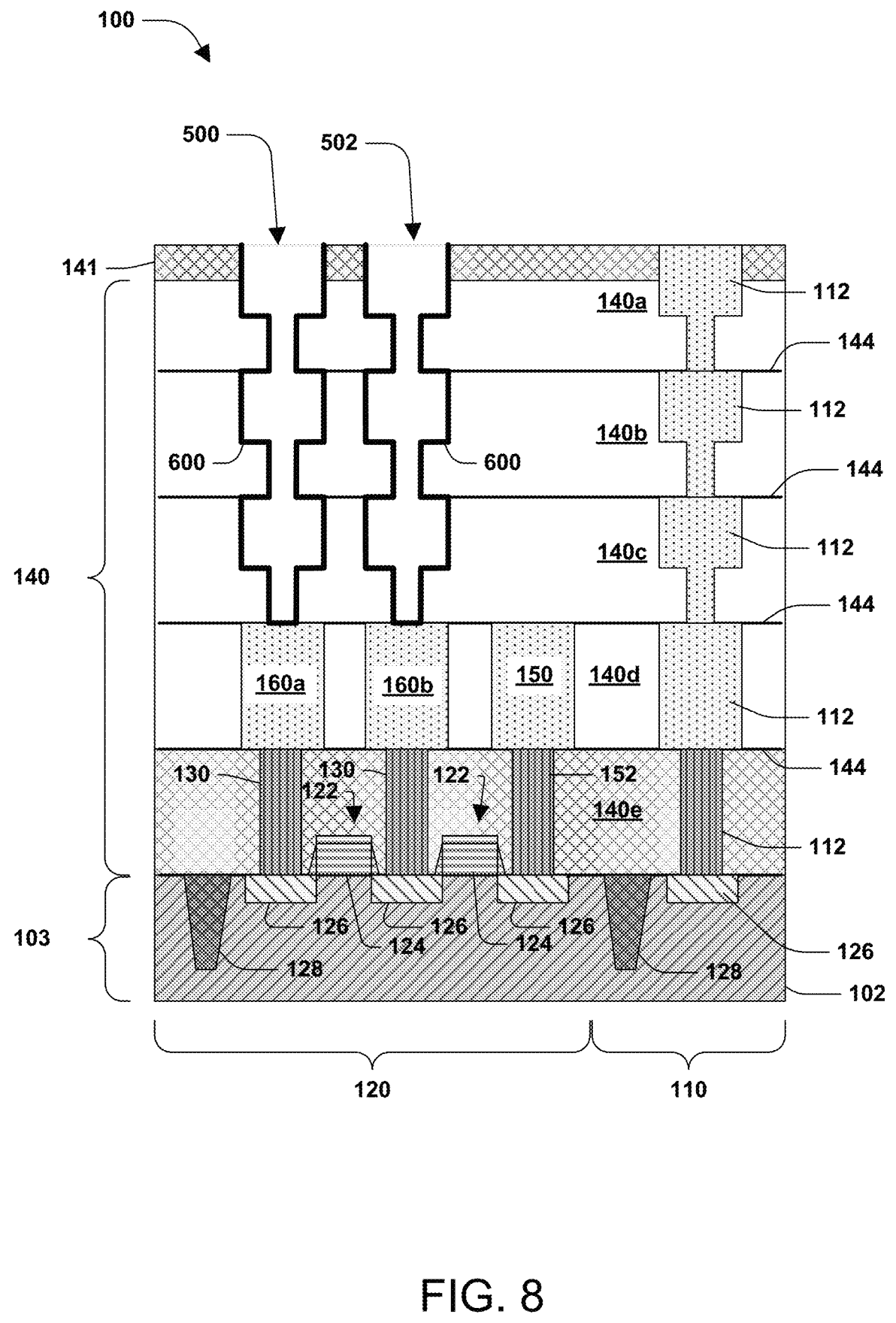

Turning to FIG. 8, in some embodiments, the first mask layer 200, the BARC layer 700 and the surface portion 602 of the first electrode 600 are removed, such as by wet etching, dry etching, etc. The first mask layer 200 is removed in any number of ways, such as by wet etching, dry etching, etc. In some embodiments, an etch chemistry for etching through and removing the BARC layer 700 from the first electrode 600 comprises $CF_4$, $CHF_3$, $CH_2F_2$, $SF_6$, $O_2$, $N_2$, Ar, He, CO, $CO_2$, $H_2$, $Cl_2$, etc., alone or in combination. In some embodiments, a chemical mechanical polishing (CMP) process and etching back process is used to remove the BARC layer 700 and the surface portions 602 (illustrated in FIG. 6) of the first electrode 600. In some embodiments, the BARC layer 700 (illustrated in FIG. 7) is formed over the first electrode 600 before removing the surface portion 602 of the first electrode 600.

Figure 9A:
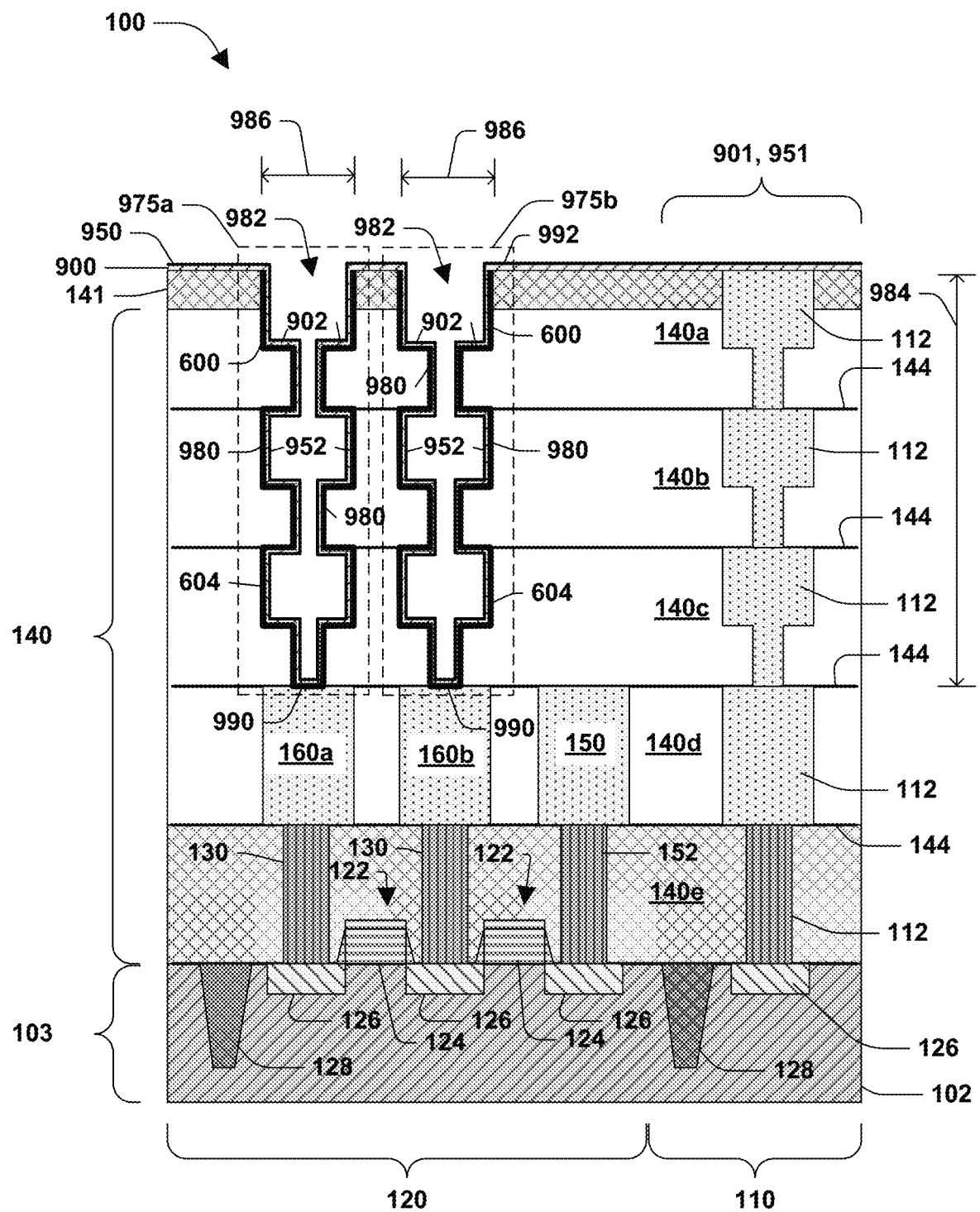
FIG. 9a illustrates a portion of a semiconductor arrangement and a cross-section view at intermediate steps of manufacturing the same, according to an embodiment.

Turning to FIG. 9a, in some embodiments, an insulating layer 900 is formed on the first electrode 600 and on the low-k dielectric layer 141. In some embodiments, the insulating layer 900 comprises a dielectric material with a relatively high dielectric constant, such as $Al_2O_3$, $ZrO_2$, $Ta_2O_5$, $HfO_2$, $La_2O_3$, $TiO_2$, $SiO_2$, etc., alone or in combination. In some embodiments, the insulating layer 900 comprises a standard dielectric material with a medium or low dielectric constant, such as $SiO_2$. Formation of the insulating layer 900 comprises at least one of thermal growth, chemical growth, atomic layer deposition (ALD), chemical vapor deposition (CVD), plasma-enhanced chemical vapor deposition (PECVD), etc. In some embodiments, an insulating surface portion 901 is formed over a portion of the low-k dielectric layer 141. In some embodiments, the insulating layer 900 has a non-linear insulating layer sidewall 902.

According to some embodiments, a second electrode 950 is formed within the first opening 500 and second opening 502 and over the insulating layer 900. Formation of the second electrode 950 comprises at least one of atomic layer deposition (ALD), sputtering, thermal evaporation, chemical vapor deposition (CVD), etc., for example. In some embodiments, the second electrode 950 comprises a conductive material, such as Ti, TiN, Ta, TaN, TaC, W, Jr, Ru, Pt, aluminum, copper, polysilicon, etc., alone or in combination. In some embodiments, an electrode surface portion 951 is formed over the insulating surface portion 901 of the insulating layer 900. According to some embodiments, the insulating layer 900 is between the first electrode 600 and the second electrode 950. In some embodiments, the second electrode 950 has a non-linear second electrode sidewall 952.

In some embodiments, a capacitor 975 is comprised of the first electrode 600, insulating layer 900, and second electrode 950 and is over the memory region 120. Although first 975a and second 975b capacitors are illustrated, any number of capacitors are contemplated. In some embodiments, the capacitor 975 extends through between 2 dielectric layers 140 to 10 dielectric layers 140. In an embodiment, the capacitor 975 has a non-linear capacitor sidewall 980 comprising the non-linear first electrode sidewall 604, the non-linear insulating layer sidewall 902, and the non-linear second electrode sidewall 952. According to some embodiments, the first electrode 600, along with the insulating layer 900 and second electrode 950, surrounds an open space 982 within the capacitor 975. In an embodiment, the second electrode 950 defines the open space 982 within the capacitor 975. In some embodiments, the open space 982 defines an area that is substantially void of material.

In some embodiments, the open space 982 extends, or is formed in (or within) any number of layers of material disposed over the substrate 102, or, any number of dielectric layers 140 in the semiconductor arrangement 100. In some embodiments, the open space 982 extends, or is formed in (or within), 2 to 10 dielectric layers 140. In some embodiments, the open space 982 is formed in (or within) the dielectric layer(s) 140a, 140b, 140c above the fourth dielectric layer 140d that includes the bit line 150. According to some embodiments, a portion of the open space 982 extends into, or is formed in (or within) the dielectric layer(s) 140 containing the bit line 150.

In some embodiments, the semiconductor arrangement 100 comprises a plurality of capacitors 975, each of which includes a capacitor sidewall 980 defining a portion of the open space 982. According to some embodiments, the semiconductor arrangement 100 includes a first open space 982 associated with or defined by the first capacitor 975a and a second open space 982 associated with or defined by the second capacitor 975b, and the height of the first open space 982 is taller than, or, alternatively, shorter than that of the second open space 982. According to some embodiments, the semiconductor arrangement 100 includes a first open space 982 associated with or defined by the first capacitor 975a and a second open space 982 associated with or defined by the second capacitor 975b, and the width of the first open space 982 is wider than or, alternatively, narrower than that of the second open space 982. In some embodiments, the semiconductor arrangement 100 includes a plurality of capacitors 975 with, or defining, a plurality of open spaces 982 or areas, where at least two of the open spaces 982 have different heights and/or widths relative to one another.

According to some embodiments, the semiconductor arrangement 100 includes at least one capacitor 975 that extends into a region or layer of the semiconductor arrangement 100 containing the bit line 150. In some embodiments, the semiconductor arrangement 100 includes at least one capacitor 975 that extends into a region or layer of the semiconductor arrangement 100 containing the bit line 150 and at least one capacitor 975 that does not extend into a region or layer of the semiconductor arrangement 100 containing the bit line 150. According to some embodiments, at least one capacitor 975 and/or open space 982 is higher than or, alternatively, shorter than, at least one other capacitor 975 and/or open space 982. In some embodiments, at least one capacitor and/or open space is wider than, or, alternatively, narrower than, at least one other capacitor 975 and/or open space 982. According to some embodiments, width of at least one capacitor 975 and/or open space 982 varies along a longitudinal axis. In some embodiments, the longitudinal axis is perpendicular, or, substantially perpendicular, to a top surface of the substrate 102. According to some embodiments, at least one capacitor 975 and/or open space 982 includes a region or portion with decreasing, or, alternatively, increasing, width(s).

In some embodiments, a height 984 of the capacitor 975 is measured from a bottom surface 990 of the first electrode 600 to a top surface 992 of the second electrode 950. In some embodiments, the height 984 of the capacitor 975 is between about 250 nm to about 1200 nm. In some embodiments, a width 986 of the capacitor 975 is measured between opposing non-linear capacitor sidewalls 980. In some embodiments, the width 986 of the capacitor 975 is between about 30 nm to about 200 nm. According to some embodiments, an aspect ratio of the capacitor 975 represents the height 984 of the capacitor 975 to the width 986 of the capacitor 975. In some embodiments, the aspect ratio of the capacitor 975 is between about 5 to about 25.

Figure 9B:
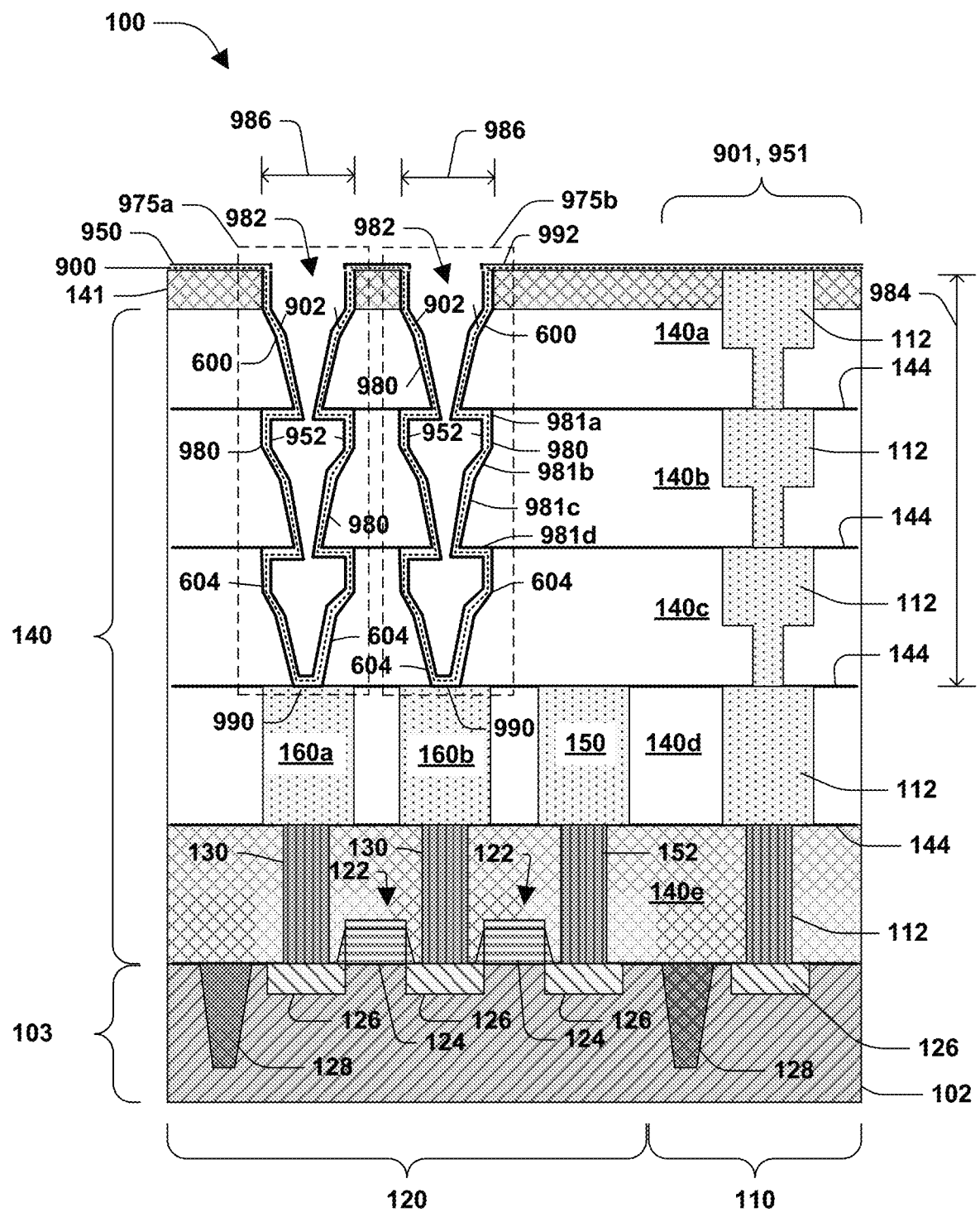
FIG. 9b illustrates a portion of a semiconductor arrangement and a cross-section view at intermediate steps of manufacturing the same, according to an embodiment.

Turning to FIG. 9b, according to some embodiments, the first capacitor 975a and second capacitor 975b are illustrated in which the non-linear capacitor sidewalls 980 have a different, non-linear shape than the non-linear capacitor sidewalls 980 illustrated in FIG. 9a. In an embodiment, the non-linear capacitor sidewalls 980 comprise a plurality of sidewall portions. According to some embodiments, the non-linear capacitor sidewalls 980 of the first capacitor 975a and second capacitor 975b comprise a first sidewall portion 981a, a second sidewall portion 981b, a third sidewall portion 981c, and a fourth sidewall portion 981d. In an embodiment, the first sidewall portion 981a extends non-linearly with respect to the second sidewall portion 981b. In an embodiment, the second sidewall portion 981b extends non-linearly with respect to the third sidewall portion 981c. In an embodiment, the third sidewall portion 981c extends non-linearly with respect to the fourth sidewall portion 981d.

Figure 10:
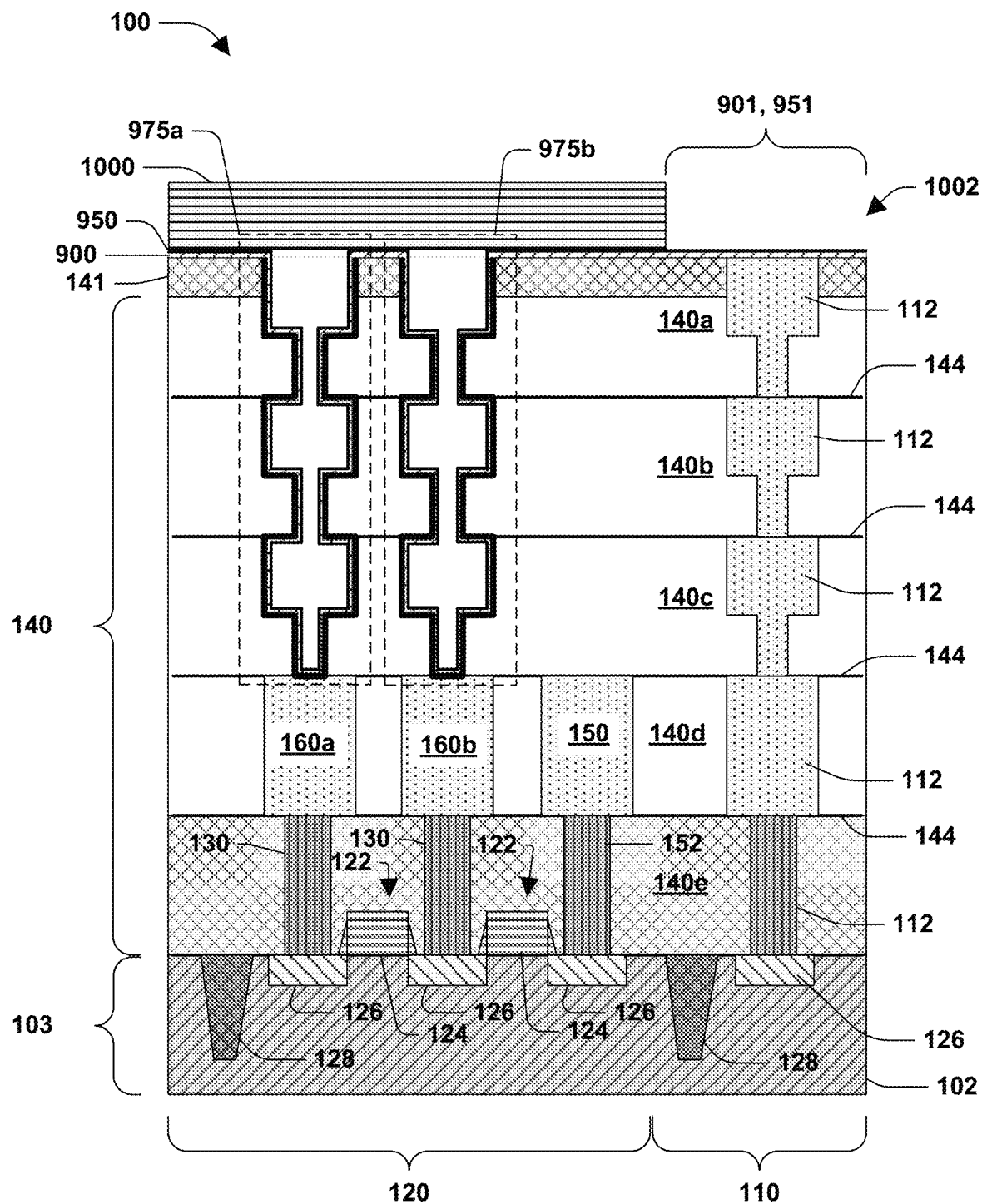
FIG. 10 illustrates a portion of a semiconductor arrangement and a cross-section view at intermediate steps of manufacturing the same, according to an embodiment.

Turning to FIG. 10, according to some embodiments, a third mask layer 1000 is formed over the second electrode 950 of the capacitor 975. In some embodiments, the third mask layer 1000 covers the memory region 120. Formation of the third mask layer 1000 comprises at least one of deposition, chemical vapor deposition (CVD), or other suitable methods, for example. The third mask layer 1000 comprises any number of materials, including carbon, oxides, silicon oxide, nitrides, silicon nitride, $Si_3N_4$, etc., alone or in combination.

In some embodiments, the third mask layer 1000 is patterned and etched to form a third mask opening 1002. In an embodiment, the third mask opening 1002 is formed over the insulating surface portion 901 of the insulating layer 900 and over the electrode surface portion 951 of the second electrode 950.

Figure 11:
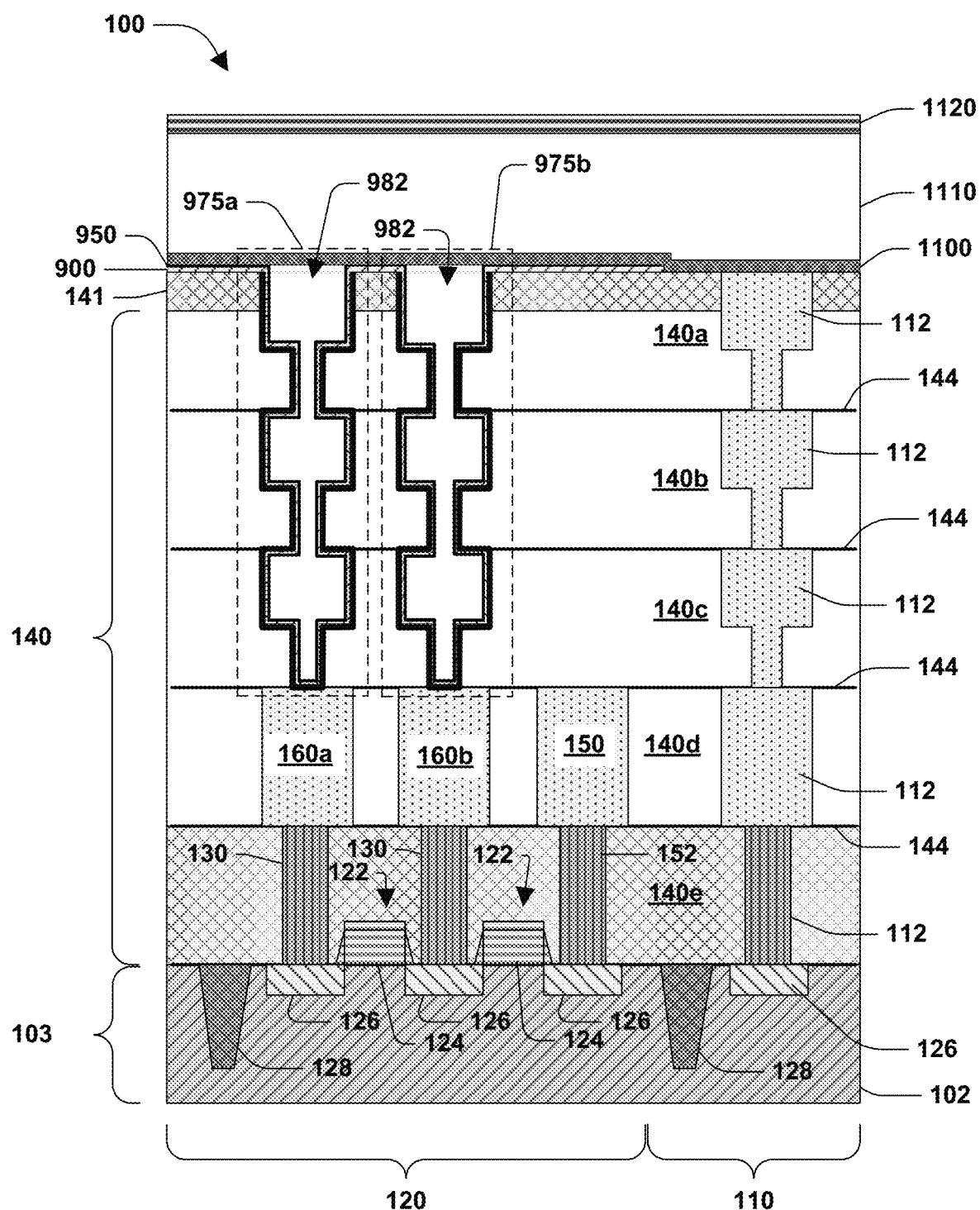
FIG. 11 illustrates a portion of a semiconductor arrangement and a cross-section view at intermediate steps of manufacturing the same, according to an embodiment.

Turning to FIG. 11, according to some embodiments, the third mask layer 1000, the insulating surface portion 901 of the insulating layer 900 and the electrode surface portion 951 of the second electrode 950 are removed, such as by wet etching, dry etching, etc. In some embodiments, an etch chemistry for removing the insulating surface portion 901 and the electrode surface portion 951 is selective enough so as to not remove the low-k dielectric layer 141.

According to some embodiments, an etch stop layer 1100 is formed over the second electrode 950, the low-k dielectric layer 141, and the open space 982. In some embodiments, the etch stop layer 1100 stops an etching process from reaching the low-k dielectric layer 141. According to some embodiments, the etch stop layer 1100 comprises a dielectric material having a different etch selectivity from the low-k dielectric layer 141. In some embodiments, the etch stop layer 1100 comprises SiC, SiN, SiCN, SiCO, CN, etc., alone or in combination. Formation of the etch stop layer 1100 comprises at least one of thermal growth, chemical growth, atomic layer deposition (ALD), chemical vapor deposition (CVD), plasma-enhanced chemical vapor deposition (PECVD), etc.

According to some embodiments, a dielectric layer 1110 is formed over the etch stop layer 1100 and over the second electrode 950 of the capacitor 975. In an embodiment, the dielectric layer 1110 comprises a standard dielectric material with a medium or low dielectric constant, such as $SiO_2$. In some embodiments, the dielectric layer 1110 comprises a dielectric material with a relatively high dielectric constant. Formation of the dielectric layer 1110 comprises at least one of thermal growth, chemical growth, atomic layer deposition (ALD), chemical vapor deposition (CVD), plasma-enhanced chemical vapor deposition (PECVD), etc. According to some embodiments, between 1 dielectric layer 1110 to 5 dielectric layers 1110 are above the capacitor 975.

According to some embodiments, a BARC layer 1120 is formed over the dielectric layer 1110. The BARC layer 1120 comprises any number of materials, including silicon, SiOC, other semiconductor materials, etc.

Figure 12:
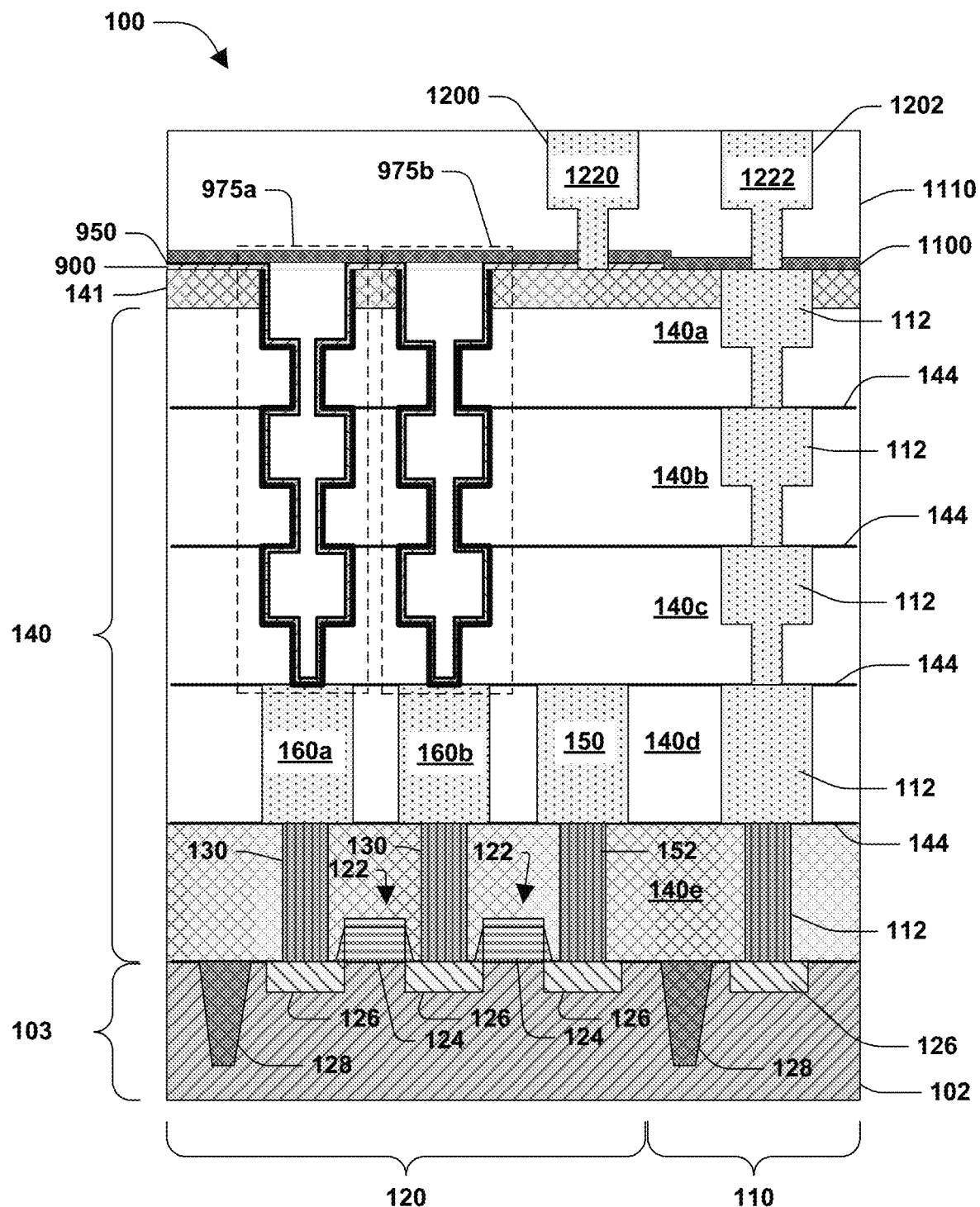
FIG. 12 illustrates a portion of a semiconductor arrangement and a cross-section view, according to an embodiment.

Turning to FIG. 12, according to some embodiments, the BARC layer 1120 is removed, such as by wet etching, dry etching, etc. In some embodiments, an etch chemistry for etching through and removing the BARC layer 1120 from the first electrode 600 comprises $CF_4$, $CHF_3$, $CH_2F_2$, $SF_6$, $O_2$, $N_2$, Ar, He, CO, $CO_2$, $H_2$, $Cl_2$, etc., alone or in combination. In some embodiments, after the BARC layer 1120 is removed, a first opening 1200 and a second opening 1202 are formed in the dielectric layer 1110 and the etch stop layer 1100.

According to some embodiments, a pick up contact 1220 is formed in the first opening 1200. In some embodiments, the pick up contact 1220 is electrically coupled to the capacitor 975. In an embodiment, the pick up contact 1220 extends through the dielectric layer 1110 and the etch stop layer 1100. In some embodiments, the pick up contact 1220 is in contact with the insulating layer 900 and the second electrode 950. Formation of the pick up contact 1220 comprises at least one of a single damascene process, dual damascene process, etc.

According to some embodiments, a via contact 1222 is formed in the second opening 1102. In an embodiment, the via contact 1222 extends through the dielectric layer 1110 and the etch stop layer 1100. In some embodiments, the via contact 1222 is in contact with the logic contact 112. Formation of the via contact 1222 comprises at least one of a single damascene process, dual damascene process, etc.

Figure 13:
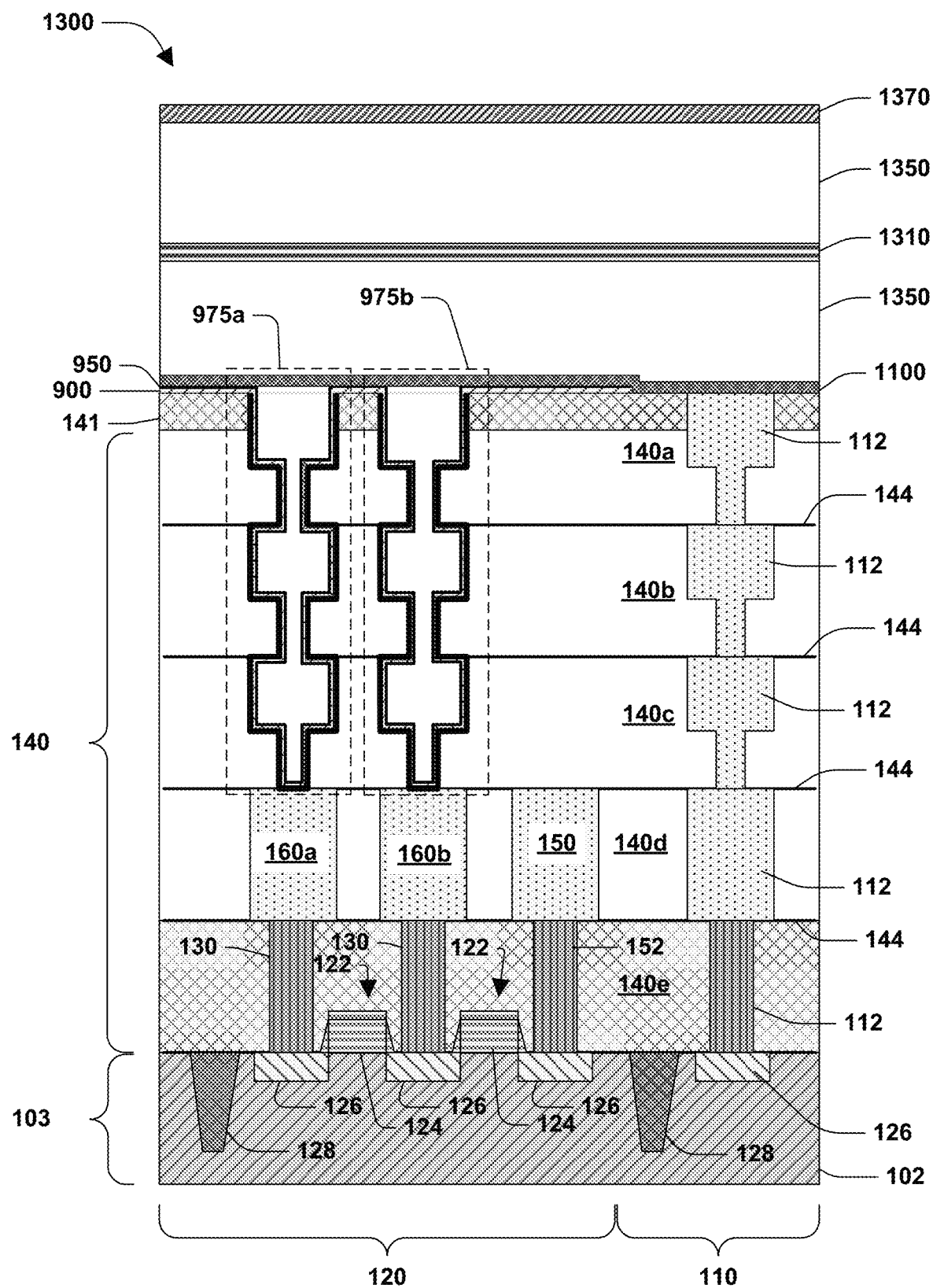
FIG. 13 illustrates a portion of a semiconductor arrangement and a cross-section view at intermediate steps of manufacturing the same, according to an embodiment.

FIG. 13 illustrates a second example semiconductor arrangement 1300. According to some embodiments, the second semiconductor arrangement 1300 comprises the logic region 110, active region 103, semiconductor device 122, dielectric layers 140, capacitor 975, etc.

According to some embodiments, after the third mask layer 1000, the electrode surface portion 951, and the insulating surface portion 901 are removed, as illustrated in FIG. 10, etch stop layers 1100, 1310 and oxide layers 1350 are formed. In some embodiments, the etch stop layer 1100 is formed over the second electrode 950 and the low-k dielectric layer 141. In some embodiments, the etch stop layers 1100, 1310 comprise a dielectric material having a different etch selectivity from the low-k dielectric layer 141. In some embodiments, the etch stop layers 1100, 1310 comprise SiN, SiCN, SiCO, CN, etc., alone or in combination. Formation of the etch stop layers 1100, 1310 comprises at least one of thermal growth, chemical growth, atomic layer deposition (ALD), chemical vapor deposition (CVD), plasma-enhanced chemical vapor deposition (PECVD), etc.

In some embodiments, at least one oxide layer 1350 is formed between the etch stop layers 1100, 1310 and above the second electrode 950 of the capacitor 975. Formation of the oxide layers 1350 comprises at least one of deposition, chemical vapor deposition (CVD), or other suitable methods, for example. The oxide layers 1350 comprise any number of materials, including oxides, silicon oxide, nitrides, silicon nitride, oxynitrides, $SiO_2$, etc., alone or in combination.

According to some embodiments, a BARC layer 1370 is formed over the oxide layer 1350. The BARC layer 1370 comprises any number of materials, including silicon, SiOC, SiON, other semiconductor materials, etc.

Figure 14:
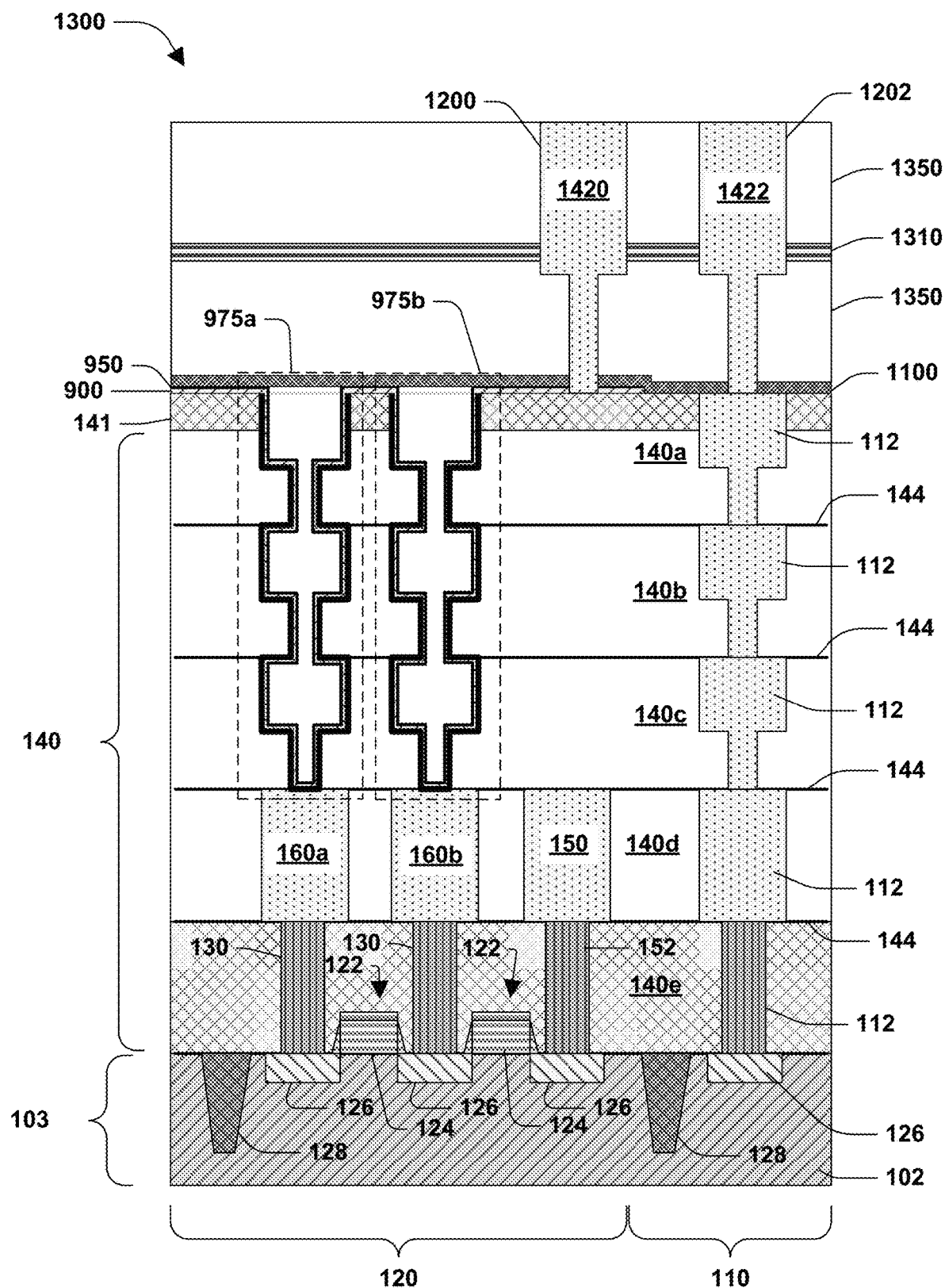
FIG. 14 illustrates a portion of a semiconductor arrangement and a cross-section view, according to an embodiment.

Turning to FIG. 14, according to some embodiments, the BARC layer 1370 is removed, such as by wet etching, dry etching, etc. In some embodiments, an etch chemistry for etching through and removing the BARC layer 1370 from the first electrode 600 comprises $CF_4$, $CHF_3$, $CH_2F_2$, $SF_6$, $O_2$, $N_2$, Ar, He, CO, $CO_2$, $H_2$, $Cl_2$, etc., alone or in combination. In some embodiments, after the BARC layer 1370 is removed, a first opening 1400 and a second opening 1402 are formed in the oxide layer 1350 and the etch stop layers 1100, 1310.

According to some embodiments, a pick up contact 1420 is formed in the first opening 1400. In an embodiment, the pick up contact 1420 extends through the oxide layer 1350 and the etch stop layers 1100, 1310. According to some embodiments, the pick up contact 1420 is electrically coupled to the capacitor 975. In some embodiments, the pick up contact 1420 is in contact with the insulating layer 900 and the second electrode 950. Formation of the pick up contact 1420 comprises at least one of a single damascene process, dual damascene process, etc.

According to some embodiments, a via contact 1422 is formed in the second opening 1402. In an embodiment, the via contact 1422 extends through the oxide layer 1350 and the etch stop layers 1100, 1310. In some embodiments, the via contact 1422 is in contact with the logic contact 112. Formation of the via contact 1422 comprises at least one of a single damascene process, dual damascene process, etc.

Figure 15:
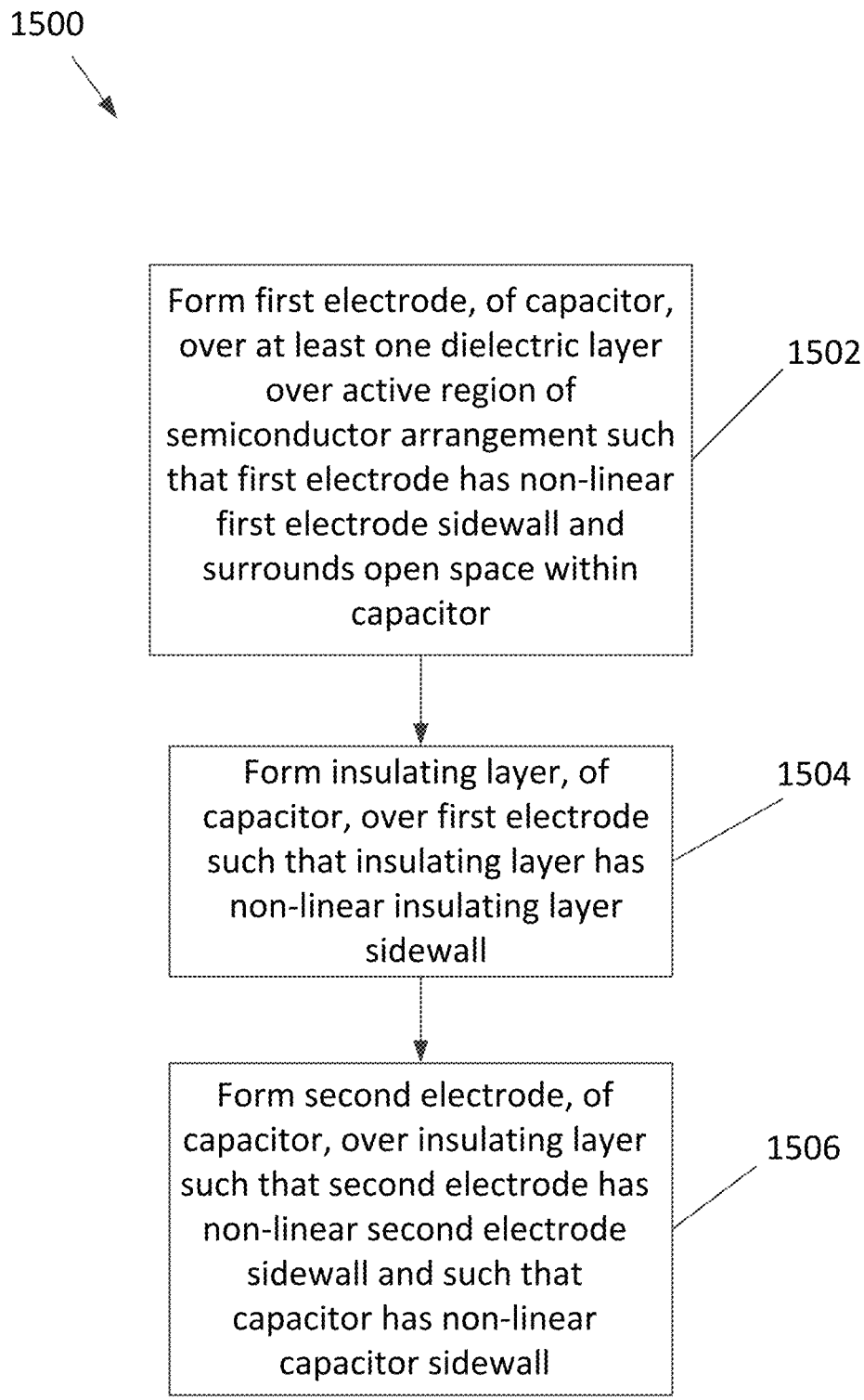
FIG. 15 is a flow chart illustrating a method of forming a semiconductor arrangement, according to an embodiment.

An example method 1500 of forming a semiconductor arrangement, such as semiconductor arrangement 100, 1300 according to some embodiments, is illustrated in FIG. 15. At 1502, a first electrode 600, of a capacitor 975, is formed over at least one dielectric layer 140 over an active region 103 of the semiconductor arrangement 100, 1300 such that the first electrode 600 has a non-linear first electrode sidewall 604 and surrounds an open space 982 within the capacitor 975. At 1504, an insulating layer 900, of the capacitor 975, is formed over the first electrode 600 such that the insulating layer 900 has a non-linear insulating layer sidewall 902. At 1506, a second electrode 950, of the capacitor 975, is formed over the insulating layer 900 such that the second electrode 950 has a non-linear second electrode sidewall 952 and such that the capacitor 975 has a non-linear capacitor sidewall 980.

According to some embodiments, the height of the bit line 150 is less than a height of the active region 103. In some embodiments, the height of the bit line 150 is less than a height of the capacitor 975. According to some embodiments, the capacitor 975 is positioned over the bit line 150, such that the semiconductor arrangement 100, 1300 comprises a capacitor-over-bitline (COB). As such, in some embodiments, the resistance ($R_b$) between the bit line 150 and the capacitor 975 is reduced. Likewise, parasitic capacitance ($C_b$) is also reduced. According to some embodiments, the capacitor 975 comprises the non-linear capacitor sidewalls 980, such that a length of the non-linear capacitor sidewalls 980 is greater than the height 984 of the capacitor 975. As such, in some embodiments, capacitance of the capacitor 975 is increased relative to a capacitor without such non-linear capacitor sidewalls.

In an embodiment, a semiconductor arrangement comprises an active region comprising a semiconductor device. In an embodiment, the semiconductor arrangement comprises a capacitor comprising a first electrode over at least one dielectric layer over the active region. In an embodiment, the first electrode surrounds an open space within the capacitor.

In an embodiment, a semiconductor arrangement comprises an active region comprising a semiconductor device. In an embodiment, the semiconductor arrangement comprises a capacitor comprising a first electrode over at least one dielectric layer over the active region. In an embodiment, the first electrode has a non-linear first electrode sidewall.

In an embodiment, a method of forming a semiconductor arrangement comprises forming a first electrode, of a capacitor, over at least one dielectric layer over an active region of the semiconductor arrangement such that the first electrode has a non-linear first electrode sidewall and surrounds an open space within the capacitor. In an embodiment, the method comprises forming an insulating layer, of the capacitor, over the first electrode such that the insulating layer has a non-linear insulating layer sidewall. In an embodiment, the method comprises forming a second electrode, of the capacitor, over the insulating layer such that the second electrode has a non-linear second electrode sidewall and such that the capacitor has a non-linear capacitor sidewall.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first region and a second region generally correspond to region A and region B or two different or two identical regions or the same type region.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
a first dielectric layer;
a first metal structure in the first dielectric layer;
a second dielectric layer over the first dielectric layer, wherein:
the second dielectric layer has a first recess defined by a first pair of sidewalls of the second dielectric layer and a second recess defined by a second pair of sidewalls of the second dielectric layer, and
the first recess and the second recess have a same cross-sectional profile;
a contact in the first recess defined by the second dielectric layer, wherein the contact has a homogenous composition and completely fills the first recess;
a capacitor, comprising:
a first electrode in the second recess defined by the second dielectric layer and overlying the first metal structure;
an insulating layer in the second recess defined by the second dielectric layer and over the first electrode; and
a second electrode in the second recess defined by the second dielectric layer and over the insulating layer; and
a pickup contact over and extending through the second electrode, wherein the pickup contact directly contacts a first sidewall of the second electrode and a first sidewall of the insulating layer.

2. The semiconductor arrangement of claim 1, wherein an open space void of material is defined between a second sidewall of the second electrode and a third sidewall of the second electrode.

3. The semiconductor arrangement of claim 2, wherein a fourth sidewall of the second electrode and a fifth sidewall of the second electrode directly contact the insulating layer.

4. The semiconductor arrangement of claim 1, comprising:
a bit line in the first dielectric layer.

5. The semiconductor arrangement of claim 1, comprising:
a third dielectric layer, wherein the first electrode directly contacts a sidewall of the second dielectric layer and a sidewall of the third dielectric layer.

6. The semiconductor arrangement of claim 1, comprising:
an etch stop layer over the second electrode, wherein an open space void of material is defined between the etch stop layer and the second electrode.

7. The semiconductor arrangement of claim 6, wherein the etch stop layer directly contacts with a second sidewall of the insulating layer.

8. The semiconductor arrangement of claim 7, wherein the etch stop layer directly contacts with a second sidewall of the second electrode.

9. The semiconductor arrangement of claim 6, wherein the etch stop layer directly contacts with a second sidewall of the second electrode.

10. The semiconductor arrangement of claim 6, wherein the pickup contact extends through the etch stop layer.

11. A semiconductor arrangement, comprising:
a plurality of dielectric layers;
a capacitor, comprising:
a first electrode extending through at least two of the plurality of dielectric layers;
an insulating layer over the first electrode and extending through the at least two of the plurality of dielectric layers; and
a second electrode over the insulating layer and extending through the at least two of the plurality of dielectric layers;
an etch stop layer over the second electrode, wherein:
the etch stop layer directly contacts a first sidewall of the insulating layer, and
an open space void of material is defined between the second electrode and the etch stop layer; and
a pickup contact extending through the etch stop layer and directly contacting a first sidewall of the second electrode and a second sidewall of the insulating layer.

12. The semiconductor arrangement of claim 11, wherein the open space is defined between a second sidewall of the second electrode and a third sidewall of the second electrode.

13. The semiconductor arrangement of claim 12, wherein a fourth sidewall of the second electrode and a fifth sidewall of the second electrode directly contact the insulating layer.

14. The semiconductor arrangement of claim 11, wherein the etch stop layer directly contacts a second sidewall of the second electrode.

15. The semiconductor arrangement of claim 11, wherein a bottommost surface of the etch stop layer is above a topmost surface of an uppermost dielectric layer of the plurality of dielectric layers.

16. The semiconductor arrangement of claim 11, wherein the open space extends through the at least two of the plurality of dielectric layers.

17. The semiconductor arrangement of claim 11, wherein the etch stop layer comprises at least one of SiC, SiN, SiCN, SiCO, or CN.

18. A semiconductor arrangement, comprising:
a first dielectric layer and a second dielectric layer over the first dielectric layer; and
a capacitor, comprising:
a first electrode extending through the first dielectric layer and the second dielectric layer;
an insulating layer over the first electrode; and
a second electrode over the insulating layer, wherein:
an open space void of material is defined by the second electrode and extends through the first dielectric layer and the second dielectric layer, wherein:

a first portion of the open space extending through the first dielectric layer has a first width, a second portion of the open space extending through the second dielectric layer has a second width less than the first width, a third portion of the open space extending through the second dielectric layer has a third width greater than the second width, and the third portion is over the second portion.

19. The semiconductor arrangement of claim 18, comprising:

an etch stop layer over the second electrode, wherein the open space is further defined by the etch stop layer.

20. The semiconductor arrangement of claim 19, wherein the etch stop layer directly contacts a sidewall of the insulating layer.

* * * * *